US012796031B2

(12) United States Patent
Jeong et al.

(10) Patent No.: US 12,796,031 B2
(45) Date of Patent: Nov. 10, 2026

(54) OXIDE SEMICONDUCTOR HAVING OHMIC JUNCTION STRUCTURE, THIN-FILM TRANSISTOR HAVING SAME, AND MANUFACTURING METHODS THEREFOR

(71) Applicant: IUCF-HYU (INDUSTRY-UNIVERSITY COOPERATION FOUNDATION HANYANG UNIVERSITY), Seoul (KR)

(72) Inventors: Jae Kyeong Jeong, Seoul (KR); Ho Jae Lee, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 755 days.

(21) Appl. No.: 18/037,638

(22) PCT Filed: Sep. 15, 2021

(86) PCT No.: PCT/KR2021/012642
§ 371 (c)(1),
(2) Date: Nov. 14, 2023

(87) PCT Pub. No.: WO2022/108074
PCT Pub. Date: May 27, 2022

(65) Prior Publication Data

US 2024/0120379 A1 Apr. 11, 2024

(30) Foreign Application Priority Data

Nov. 19, 2020 (KR) ........................ 10-2020-0155746
Nov. 19, 2020 (KR) ........................ 10-2020-0155747

(51) Int. Cl.
*H10D 62/13* (2025.01)
*H10D 30/67* (2025.01)
(Continued)

(52) U.S. Cl.
CPC ....... *H10D 62/151* (2025.01); *H10D 30/6755* (2025.01); *H10D 62/80* (2025.01);
(Continued)

(58) Field of Classification Search
CPC ............... H10D 30/67; H10D 30/6713; H10D 30/6755; H10D 62/13; H10D 62/151;
(Continued)

(56) References Cited

U.S. PATENT DOCUMENTS

2015/0171225 A1* 6/2015 Shi ..................... H10D 30/6704 257/43
2015/0179773 A1* 6/2015 Ahmed .............. H10D 30/6704 257/43

(Continued)

FOREIGN PATENT DOCUMENTS

JP 2011135063 A * 7/2011 ....... H01L 21/02631
JP 2019-057712 A 4/2019

(Continued)

OTHER PUBLICATIONS

International Search Report for PCT/KR2021/012642 dated Jan. 3, 2022 (PCT/ISA/210).

*Primary Examiner* — Brook Kebede
(74) *Attorney, Agent, or Firm* — Sughrue Mion, PLLC

(57) ABSTRACT

Various embodiments relate to an oxide semiconductor having improved resistance through cation/anion substitutional doping, and a manufacturing method therefor, in which: an IGZO channel layer is prepared; carrier diffusion is induced in the IGZO channel layer, by using a group 4 element or a group 7 element, so that carriers remain in the
(Continued)

IGZO channel layer; and through carrier diffusion, low resistance contact with the IGZO channel layer can be implemented, with respect to a metal electrode. Various embodiments relate to a thin-film transistor having an ohmic junction structure of an oxide semiconductor, and a manufacturing method therefor. Provided are a thin-film transistor, and a manufacturing method therefor, the thin-film transistor comprising: a substrate; an IGZO channel layer which is disposed on the substrate and is divided into a first region and a second region that has at least one groove formed therein; a first electrode which is disposed on the first region of the IGZO channel layer; an ohmic junction layer which is made of an n+ oxide and is disposed in a groove; and a second electrode which is bonded on the ohmic junction layer.

17 Claims, 11 Drawing Sheets

(51) Int. Cl.

| | |
|---|---|
| ***H10D 62/80*** | (2025.01) |
| ***H10D 99/00*** | (2025.01) |
| *H10P 32/10* | (2026.01) |
| *H10P 32/12* | (2026.01) |
| *H10P 32/14* | (2026.01) |

(52) U.S. Cl.
CPC ............. *H10D 99/00* (2025.01); *H10P 32/12* (2026.01); *H10P 32/14* (2026.01); *H10P 32/17* (2026.01)

(58) Field of Classification Search
CPC ...... H10D 62/80; H10D 64/01; H10D 64/011; H10D 64/62; H10D 99/00; H10P 32/12; H10P 32/14; H10P 32/17; H10P 95/00
See application file for complete search history.

(56) References Cited

U.S. PATENT DOCUMENTS

2017/0294456 A1* 10/2017 Lee ...................... H10D 86/423
2018/0315778 A1* 11/2018 Li ...................... H10D 86/0231

FOREIGN PATENT DOCUMENTS

| | | | |
|---|---|---|---|
| KR | 10-2008-0015891 | A | 2/2008 |
| KR | 10-2011-0073038 | A | 6/2011 |
| KR | 10-2016-0106278 | A | 9/2016 |
| KR | 10-2017-0130670 | A | 11/2017 |
| KR | 10-2020-0031587 | A | 3/2020 |

* cited by examiner

OXIDE SEMICONDUCTOR HAVING OHMIC JUNCTION STRUCTURE, THIN-FILM TRANSISTOR HAVING SAME, AND MANUFACTURING METHODS THEREFOR

CROSS REFERENCE TO RELATED APPLICATIONS

This application is a National Stage of International Application No. PCT/KR2021/012642 filed Sep. 15, 2021, claiming priorities based on Korean Patent Application No. 10-2020-0155746 filed Nov. 19, 2020 and Korean Patent Application No. 10-2020-0155747 filed Nov. 19, 2020.

TECHNICAL FIELD

Various example embodiments relate to an oxide semiconductor in an ohmic junction structure, a thin-film transistor having the same, and manufacturing methods thereof.

RELATED ART

In the case of a memory device that uses a silicon-based material, specific contact resistance (specific contact resistivity) showing resistance corresponding to a unit area of a contact portion in which a semiconductor and an electrode meet is a level of $<10^{-8}[\Omega\cdot cm^2]$. Meanwhile, in the case of an indium gallium zinc oxide (IGZO) oxide semiconductor that is currently used for a display, the specific contact resistance is about $10^{-3}\sim10^{4}[\Omega\cdot cm^2]$. Therefore, for use in the memory device, it is necessary to reduce the specific contact resistance of the IGZO oxide semiconductor.

DETAILED DESCRIPTION

Technical Subject

Various example embodiments provide an oxide semiconductor having low resistance and a manufacturing method thereof.

Various example embodiments provide a thin-film transistor having low resistance and a manufacturing method thereof.

Solution

Various example embodiments may provide an oxide semiconductor having improved resistance through cation/anion substitutional doping and a manufacturing method thereof.

According to various example embodiments, a manufacturing method of an oxide semiconductor may include preparing an indium gallium zinc oxide (IGZO) channel layer; and inducing carrier diffusion in the IGZO channel layer using a group 4 element or a group 7 element such that carriers remain in the IGZO channel layer.

According to various example embodiments, the oxide semiconductor may be implemented with the aforementioned method and a low-resistance contact may be implemented on the IGZO channel layer with respect to a metal electrode through the carrier diffusion.

A thin-film transistor according to various example embodiments may include a substrate; an IGZO channel layer provided on the substrate and divided into a first region and a second region in which at least one groove is formed; a first electrode provided on the first region of the IGZO channel layer; an ohmic junction layer made of an n+ oxide and provided within the groove; and a second electrode bonded on the ohmic junction layer.

A manufacturing method of a thin-film transistor according to various example embodiments may include preparing an IGZO channel layer on a substrate; providing a first electrode on a first region of the IGZO channel layer; forming at least one groove in a second region of the IGZO channel layer; forming an ohmic junction layer within the groove using an n+ oxide; and bonding a second electrode on the ohmic junction layer.

Effect of Invention

According to various example embodiments, gain for carriers may be generated in an indium gallium zinc oxide (IGZO) channel layer in such a manner that a metal element corresponding to the cation of the IGZO channel layer is substituted with a group 4 element or an oxygen element corresponding to the anion of the IGZO channel layer is substituted with a group 7 element. That is, as a carrier diffusion proceeds, each group 4 element may provide four carriers to the metal element of the IGZO channel layer, such that a single carrier may remain in the IGZO channel layer. Meanwhile, as the carrier diffusion proceeds, the metal element does not provide two carriers to an oxygen element and instead, provides a single carrier to each group 7 element, resulting in allowing a single carrier to remain in the IGZO channel layer. Through this, for a metal electrode, carrier concentration of the IGZO channel layer may increase and thus, a low-resistance contact, that, an ohmic junction may be implemented in the IGZO channel layer. Through this, an oxide semiconductor having the IGZO channel layer may be used for a memory device.

According to various example embodiments, since an ohmic junction layer is formed on an IGZO channel layer using an n+ oxide having high carrier concentration, a second electrode may be bonded to the ohmic junction layer without directly contacting the IGZO channel layer. Here, since the ohmic junction layer has a high carrier concentration, a low-resistance contact may be implemented between the ohmic junction layer and the second electrode. That is, specific contact resistance for the second electrode may be significantly improved in a thin-film transistor having the IGZO channel layer. Through this, the thin-film transistor having the IGZO channel layer may be used for a memory device.

BEST MODE

Hereinafter, various example embodiments will be described with reference to the accompanying drawings.

In an oxide semiconductor, if carrier concentration of an indium gallium zinc oxide (IGZO) channel layer increases due to a contact between the IGZO channel layer and a metal electrode, migration of electrons may become easy and resistance of the IGZO channel layer may decrease. To this end, a low-resistance contact through cation/anion substitutional doping of the IGZO channel layer may be implemented.

Referring to ions for the IGZO channel layer for doping, indium (In) and gallium (Ga) correspond to +3 valent cations ($In3^{3+}$, $Ga^{3+}$), zinc (Zn) corresponds to a +2 valent cation ($Zn^{2+}$), oxygen (O) corresponds to a −2 valent anion ($O^{2-}$), cations provide carriers (also referred to as electrons) and anions may receive carriers. For substitutional doping, a material that may be replaced due to a similar atomic size to that of an existing cation or anion and may additionally provide a carrier may be used.

Under this condition, in various example embodiments, a group 4 element or a group 7 element may be used as a substitutional doping material. That is, a cation may be replaced with at least one of germanium (Ge), tin (Sn), lead (b), silicon (Si), or carbon (C) each corresponding to a group 4 element that may become a +4 valent cation capable of providing one more electron than the existing +2 and +3 valent cations, and an anion may be replaced with at least one of fluorine (F), chlorine (Cl), bromine (Br), or iodine (I) each corresponding to a group 7 element having more carriers than a −2 valent anion that is a group 6 element.

According to various example embodiments, electrons that are carriers may be further provided to an IGZO channel layer by substituting a metal element (+2 valent $Zn^{2+}$, +3 valent $In3^{3+}$ and $Ga^{3+}$) corresponding to the cation of the IGZO channel layer with a group 4 element, that is, a +4 valent element and by substituting an oxygen element (−2 valent $O^{2-}$) corresponding to the anion with a group 7 element. Through this, a low-resistance contact may be formed by achieving a high carrier concentration in a portion in contact with a metal electrode of the IGZO channel layer.

Figure 1A:
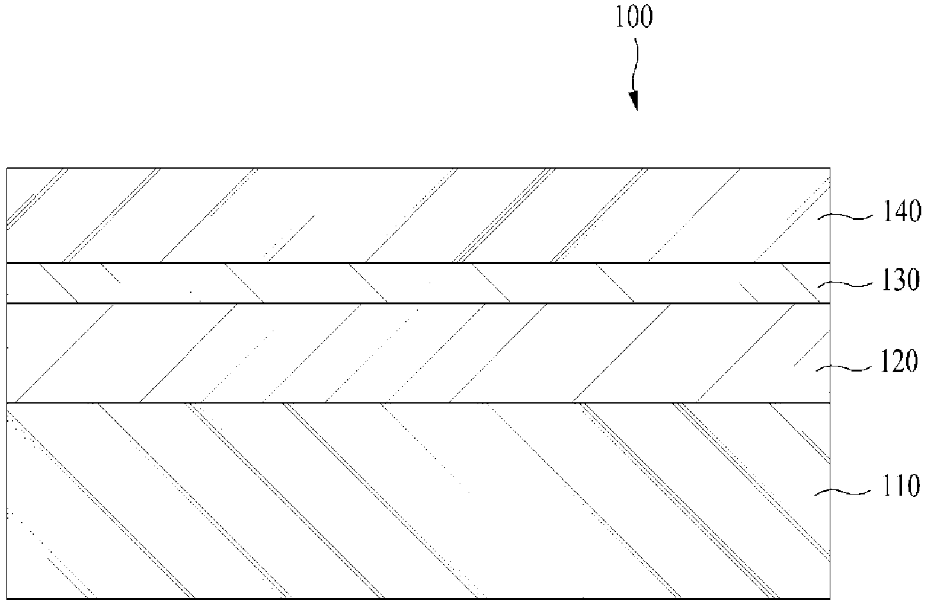
FIG. 1A illustrates an oxide semiconductor according to first example embodiments.
Figure 1B:
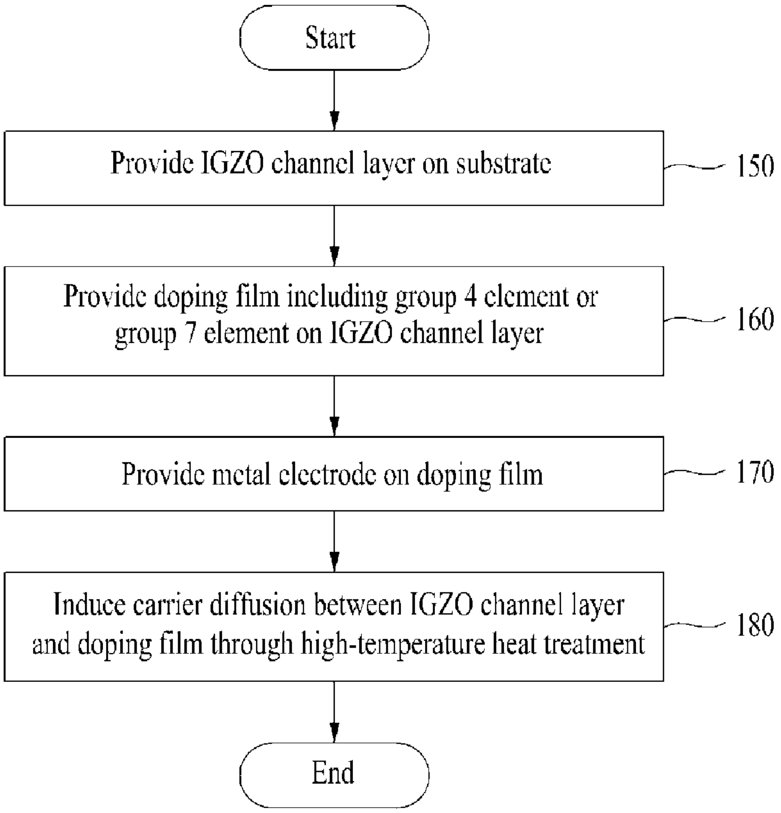
FIG. 1B illustrates a manufacturing method of an oxide semiconductor according to first example embodiments.
Figure 2:
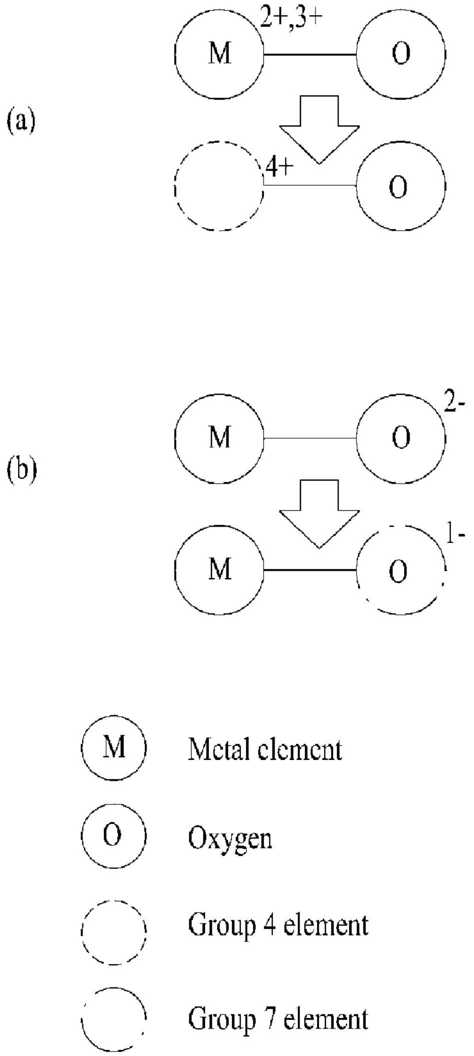
FIG. 2 illustrates a carrier diffusion for an oxide semiconductor according to first example embodiments.

FIG. 1A illustrates an oxide semiconductor 100 according to first example embodiments. FIG. 1B illustrates a manufacturing method of the oxide semiconductor 100 according to first example embodiments. FIG. 2 illustrates carrier diffusion for the oxide semiconductor 100 according to first example embodiments.

Referring to FIG. 1A, the oxide semiconductor 100 according to the first example embodiments may include a substrate 100, an IGZO channel layer 120, a doping film 130, and a metal electrode 140. The oxide semiconductor 100 according to the first example embodiments may be manufactured according to a procedure of FIG. 1B and, through this, a low-resistance contact, that is, an ohmic junction may be implemented in the IGZO channel layer 120. This will be further described with reference to FIG. 1B and FIG. 2.

In operation 150, the IGZO channel layer 120 may be prepared. Here, the substrate 110 may be prepared and the IGZO channel layer 120 may be provided on the substrate 110. Here, the IGZO channel layer 120 may include a metal element and may be implemented through combination of the metal element and an oxygen element. The metal element may include a group 2 element, that is, zinc (Zn) and a group 3 element, that is, gallium (Ga) and indium (In). In operations 160, 170, and 180, a carrier diffusion may be induced with respect to the IGZO channel layer 120 using a group 4 element or a group 7 element. The group 4 element may include at least one of, for example, germanium (Ge), tin (Sn), lead (Pb), silicon (Si), or carbon (C). The group 7 element may include at least one of, for example, fluorine (F), chlorine (Cl), bromine (Br), or iodine (1).

In detail, in operation 160, the doping film 130 may be provided on the IGZO channel layer 120. Here, the doping film 130 may be made of a compound that includes the group 4 element or the group 7 element. For example, the compound may include at least one of ITO, IZTO, $AlF_3$, $InF_3$, $GaF_3$, or $ZF_2$. Here, the doping film 130 may be provided on the IGZO channel layer 120 based on a thin film deposition method, for example, a physical vapor deposition (PVD) method, a chemical vapor deposition (CVD) method, and an atomic layer deposition (ALD) method. In operation 170, the metal electrode 140 may be provided on the doping film 130. In operation 180, the carrier diffusion may be induced between the IGZO channel layer 120 and the doping film 130 through high-temperature heat treatment. Through this, the carrier diffusion may proceed between the IGZO channel layer 120 and the group 4 element or between the IGZO channel layer 120 and the group 7 element.

Therefore, the oxide semiconductor 100 according to the first example embodiments may be acquired. Here, as a result of the carrier diffusion, a carrier may remain in the IGZO channel layer 120. According to an example embodiment, referring to (a) of FIG. 2, when the doping film 130 is made of group 4 elements, each group 4 element may provide four carriers to a metal element of the IGZO channel layer 120 as the carrier diffusion proceeds, such that a single carrier may remain in the IGZO channel layer 120. According to another example embodiment, referring to (b) of FIG. 2, when the doping film 130 is made of group 7 elements, the metal element of the IGZO channel layer 120 may not provide two carriers to an oxygen element and, instead, may provide a single carrier to each group 7 element, such that a single carrier may remain in the IGZO channel layer 120. Through this, for the metal electrode 140, a carrier concentration of the IGZO channel layer 120 may increase and accordingly, a low-resistance contact, that is, an ohmic junction may be implemented in the IGZO channel layer 120.

Figure 3A:
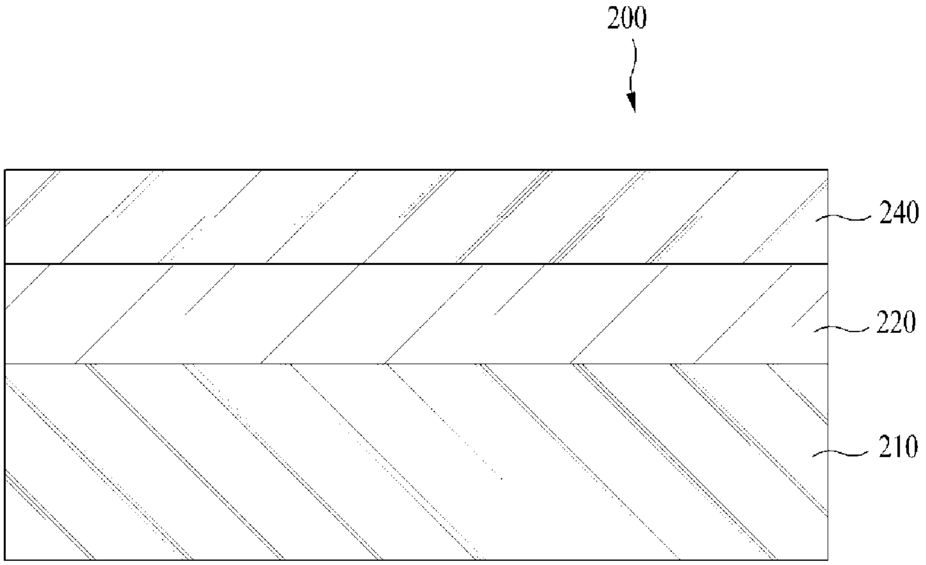
FIG. 3A illustrates an oxide semiconductor according to second example embodiments.
Figure 3B:
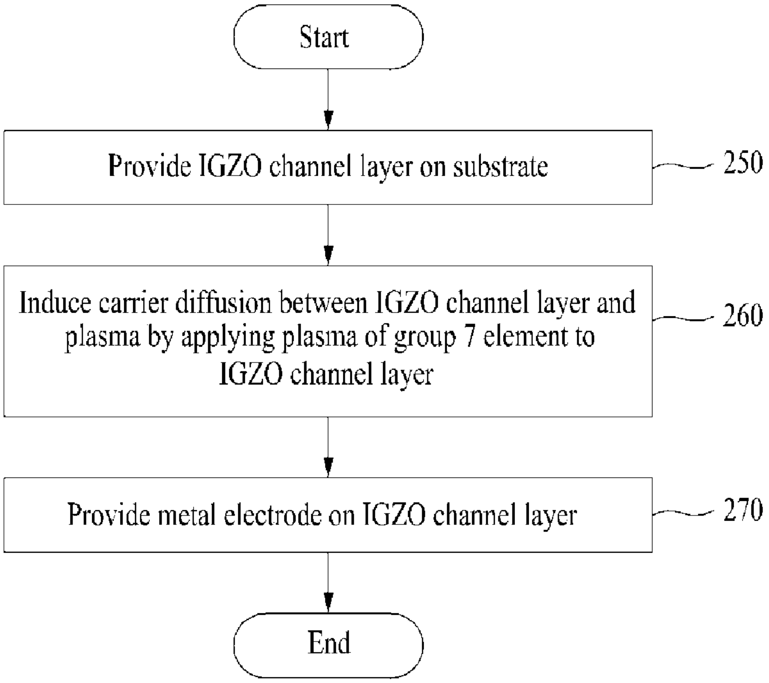
FIG. 3B illustrates a manufacturing method of an oxide semiconductor according to second example embodiments.
Figure 4:
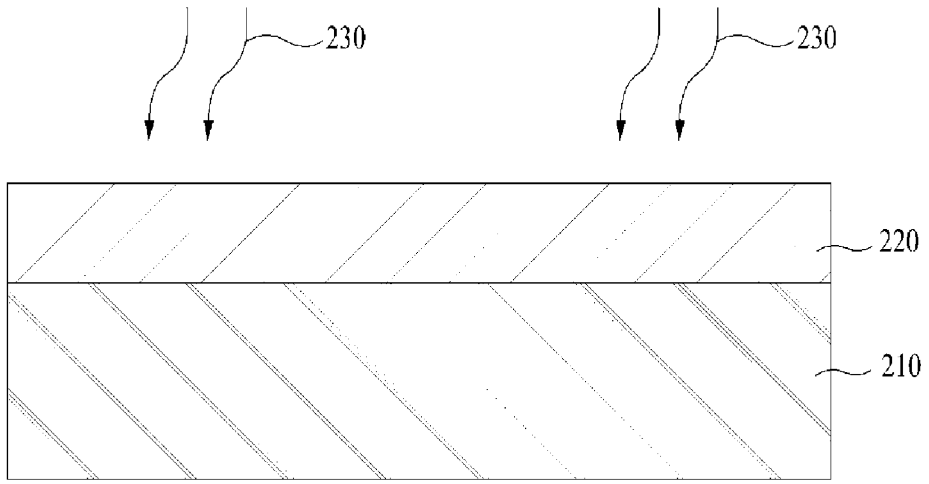
FIG. 4 illustrates a manufacturing method of an oxide semiconductor according to second example embodiments.
Figure 5:
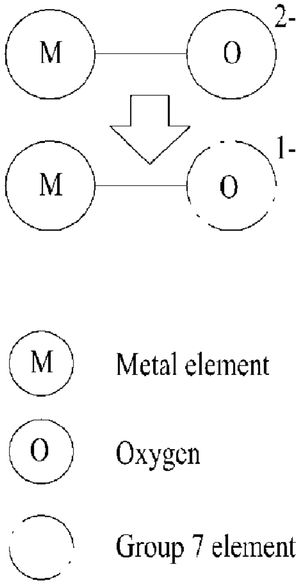
FIG. 5 illustrates a carrier diffusion for an oxide semiconductor according to second example embodiments.

FIG. 3A illustrates an oxide semiconductor 200 according to second example embodiments. FIG. 3B illustrates a manufacturing method of the oxide semiconductor 200 according to second example embodiments. FIG. 4 illustrates a manufacturing method of the oxide semiconductor 200 according to second example embodiments. FIG. 5 illustrates a carrier diffusion for the oxide semiconductor 200 according to second example embodiments.

Referring to FIG. 3A, the oxide semiconductor 200 according to the second example embodiments may include a substrate 210, an IGZO channel layer 220, and a metal electrode 240. The oxide semiconductor 200 may be manufactured according to a procedure of FIG. 3B and, through this, a low-resistance contact, that is, an ohmic junction may be implemented in the IGZO channel layer 220. Description related thereto is made in detail with reference to FIGS. 3B, 4, and 5.

In operation 250, the IGZO channel layer 220 may be prepared. Here, the substrate 210 may be prepared and the IGZO channel layer 220 may be provided on the substrate 210. Here, the IGZO channel layer 220 may include a metal element and may be implemented through combination of the metal element and an oxygen element. The metal element may include a group 2 element, that is, zinc (Zn) and a group 3 element, that is, gallium (Ga) and indium (In). In operations 260 and 270, a carrier diffusion may be induced with respect to the IGZO channel layer 220 using a group 4 element or a group 7 element. The group 4 element may include at least one of, for example, germanium (Ge), tin (Sn), lead (Pb), silicon (Si), or carbon (C). The group 7 element may include at least one of, for example, fluorine (F), chlorine (Cl), bromine (Br), or iodine (I).

In detail, in operation 260, referring to FIG. 4, the carrier diffusion may be induced between the IGZO channel layer 220 and plasma 230 by applying the plasma 230 of the group 7 element to the IGZO channel layer 220. For example, the plasma 230 may include at least one of $CF_4$, $CHF_3$, or $BCl_3$. Through this, the carrier diffusion may proceed between the IGZO channel layer 220 and the group 7 element. In operation 270, the metal electrode 240 may be provided on the IGZO channel layer 220.

Therefore, the oxide semiconductor 200 according to the second example embodiments may be acquired. As a result of the carrier diffusion, a carrier may remain in the IGZO channel layer 220. Referring to FIG. 5, as the carrier diffusion proceeds, a metal element of the IGZO channel layer 220 does not provide two carriers to an oxygen element and, instead, provides a single carrier to each group 7 element, such that a single carrier may remain in the IGZO channel layer 220. Through this, for the metal electrode 240, a carrier concentration of the IGZO channel layer 220 may increase and accordingly, a low-resistance contact, that is, an ohmic junction may be implemented in the IGZO channel layer 220.

According to various example embodiments, gain for carriers may be generated in the IGZO channel layer 120, 220 in such a manner that a metal element corresponding to the cation of the IGZO channel layer 120, 220 is substituted with a group 4 element, or an oxygen element corresponding to the anion of the IGZO channel layer 120, 220 is substituted with a group 7 element. That is, as a carrier diffusion proceeds, each group 4 element may provide four carriers to the metal element of the IGZO channel layer 120, 220, such that a single carrier may remain in the IGZO channel layer 120, 220. Meanwhile, as the carrier diffusion proceeds, the metal element of the IGZO channel layer 120, 220 may not provide two carriers to an oxygen element and, instead, may provide a single carrier to each group 7 element, resulting in allowing a single carrier to remain in the IGZO channel layer 120, 220. Through this, for the metal electrode 140, 240, a carrier concentration of the IGZO channel layer 120, 220 may increase and thus, a low-resistance contact, that, an ohmic junction may be implemented in the IGZO channel layer 120, 220. Through this, the oxide semiconductor 100, 200 having the IGZO channel layer 120, 220 may be used for a memory device.

A manufacturing method of the oxide semiconductor 100, 200 according to various example embodiments may include preparing the IGZO channel layer 120, 220, and inducing a carrier diffusion in the IGZO channel layer 120, 220 using a group 4 element or a group 7 element such that carriers may remain in the IGZO channel layer 120, 220.

According to various example embodiments, the group 4 element may provide four carriers to the IGZO channel layer 120, 220 through the carrier diffusion, such that a single carrier may remain in the IGZO channel layer 120, 220.

According to various example embodiments, the group 4 element may include at least one of germanium (Ge), tin (Sn), lead (Pb), silicon (Si), or carbon (C).

According to various example embodiments, the IGZO channel layer 120, 220 may provide a single carrier for the group 7 element through the carrier diffusion, such that a single carrier may remain in the IGZO channel layer 120, 220.

According to various example embodiments, the group 7 element may include at least one of fluorine (F), chlorine (Cl), bromine (Br), or iodine (I).

According to the first example embodiments, the inducing of the carrier diffusion may include providing the doping film 130 made of the group 4 element or the group 7 element on the IGZO channel layer 120 and inducing the carrier diffusion between the IGZO channel layer 120 and the doping film 130 through high-temperature heat treatment.

According to the first example embodiments, the inducing of the carrier diffusion may further include providing the metal electrode 140 on the doping film 130 before the high-temperature heat treatment.

According to the first example embodiments, a low-resistance contact may be implemented on the IGZO channel layer 120 with respect to the metal electrode 140 through the carrier diffusion.

According to the second example embodiments, the inducing of the carrier diffusion may include applying plasma of the group 7 element to the IGZO channel layer 220 and inducing the carrier diffusion between the IGZO channel layer 220 and the plasma.

According to the second example embodiments, a low-resistance contact may be implemented on the IGZO channel layer 220 with respect to the metal electrode 240 provided on the IGZO channel layer 220 through the carrier diffusion.

According to various example embodiments, the preparing of the IGZO channel layer 120, 220 may include providing the IGZO channel layer 120, 220 on the substrate 110, 210.

The oxide semiconductor 100, 200 according to various example embodiments may be manufactured by the aforementioned method and the low-resistance contact may be implemented on the IGZO channel layer 120, 220 with respect to the metal electrode 140, 240 through the carrier diffusion.

According to various example embodiments, due to a characteristic of a manufacturing process of a thin-film transistor in a self-aligned structure, a gate electrode (gate) and an insulating layer for the gate electrode may be etched together using a single mask. After etching is performed using the characteristic to expose a partial area of the IGZO channel layer, an n+ oxide may be deposited and an ohmic junction layer may be provided. Here, the ohmic junction layer may structurally contact a source electrode (source) and a drain electrode (drain). As described above, by changing a material that contacts the source electrode and the drain electrode in the IGZO channel layer, specific contact resistance (specific contact resistivity) of the IGZO oxide semiconductor may decrease. Here, the specific contact resistance of the IGZO oxide semiconductor may be improved by $10^{-6}[\Omega\cdot cm^2]$ or more.

According to various example embodiments, an n+ oxide may be an n+ typed oxide having a high carrier (also, referred to as electron) concentration. Here, dissimilar to a material having a high specific gravity of indium (In) related to high mobility or the existing channel deposition condition, the n+ oxide may represent a material having a high carrier concentration by controlling an oxygen vacancy through adjustment of an oxygen partial pressure. For example, the n+ oxide may include at least one of indium gallium tin oxide (IGTO), indium gallium oxide (IGO), indium tin oxide (ITO), indium gallium zinc tin oxide (IGZTO), or aluminum-doped zinc oxide (AZO).

According to various example embodiments, an electrode bonded to an ohmic junction layer may be made of a next-generation metal material, not a conventional metal material, and may include, for example, at least one of tungsten (W), cobalt (Co), or ruthenium (Ru). This is because a phenomenon that specific contact resistance of an IGZO oxide semiconductor increases occurs due to scattering when the electrode is manufactured in a size of several nanometers using the conventional metal material, for example, aluminum (Al), copper (Cu), silver (Ag), and the like.

In various example embodiments, after an IGZO channel layer is selectively etched using a characteristic of a self-aligned structure, an n+ oxide having a high carrier concentration may be deposited by controlling an oxygen vacancy through adjustment of an oxygen partial pressure and accordingly, the ohmic junction layer may be provided, and the electrode may be deposited on the ohmic junction layer. Through this, more excellent specific contact resistance may be secured than when the electrode is directly deposited on the existing IGZO channel layer. The IGZO oxide semiconductor according to various example embodiments may be applied to a memory device that requires low resistance, for example, a 3D DRAM and a V-NAND memory.

Figure 6:
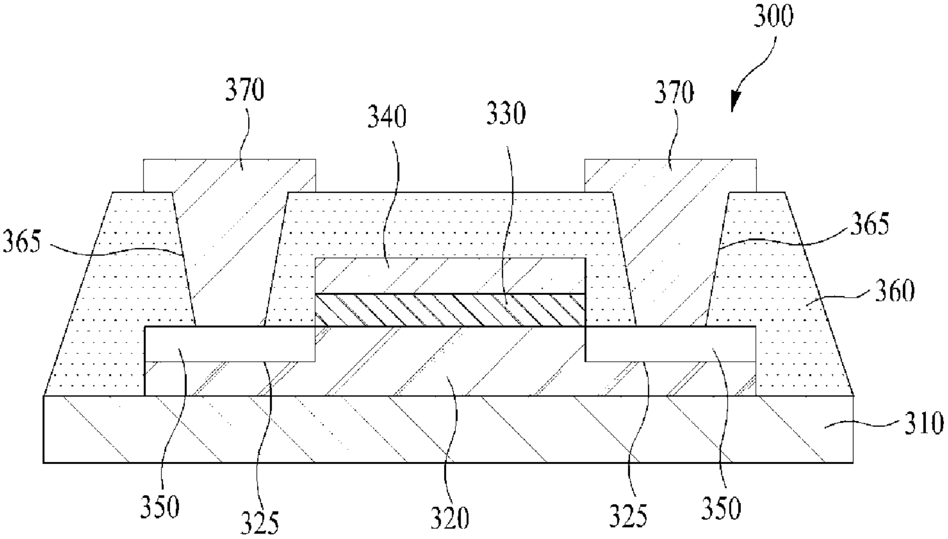
FIG. 6 illustrates a thin-film transistor according to various example embodiments.

FIG. 6 illustrates a thin-film transistor 300 according to various example embodiments.

Referring to FIG. 6, the thin-film transistor 300 according to various example embodiments may include a substrate 310, an IGZO channel layer 320, an insulating layer 330, a first electrode 340, at least one ohmic junction layer 350, a protective layer 360, and at least one second electrode 370.

The substrate 310 may support the IGZO channel layer 320, the insulating layer 330, the first electrode 340, the ohmic junction layer 350, the protective layer 360, and the second electrode 370. For example, the substrate 310 may include silicon (Si).

The IGZO channel layer 320 may be provided on the substrate 310. Here, the IGZO channel layer 320 may be made through combination of indium (In), gallium (Ga), zinc (Zn), and oxygen (O). The IGZO channel layer 320 may be divided into a first region and a second region. According to an example embodiment, the first region may be provided at the center of the IGZO channel layer 320 and the second region may surround the first region. Also, at least one groove 325 may be formed in the second region. According to an example embodiment, when a plurality of grooves 325 is formed in the second region of the IGZO channel layer 320, the grooves 325 may be spaced apart from each other.

The insulating layer 330 may be provided on the IGZO channel layer 320. Here, the insulating layer 330 may be provided to separate the first electrode 340 from the IGZO channel layer 320. To this end, the insulating layer 330 may be provided between the IGZO channel layer 320 and the first electrode 340. The insulating layer 330 may be provided in the first region of the IGZO channel layer 320.

The first electrode 340 may be provided on the insulating layer 330. Here, the first electrode 340 may be provided on the IGZO channel layer 320 by interposing the insulating layer 330 between the first electrode 340 and the IGZO channel layer 320. The first electrode 340 may be formed on the first region of the IGZO channel layer 320. Here, the first electrode 340 may not be in direct contact with the IGZO channel layer 320. According to an example embodiment, the first electrode 340 may be a gate electrode (gate). For example, the first electrode 340 may include at least one of tungsten (W), cobalt (Co), or ruthenium (Ru).

The ohmic junction layer 350 may be individually provided within the groove 325 of the IGZO channel layer 320. According to an example embodiment, when the plurality of grooves 325 is formed in the second region of the IGZO channel layer 320, the plurality of ohmic junction layers 350 may be provided in the grooves 325, respectively. Here, the ohmic junction layer 350 may be made of an n+ oxide. For example, the n+ oxide may include at least one of indium gallium tin oxide (IGTO), indium gallium oxide (IGO), indium tin oxide (ITO), indium gallium zinc tin oxide (IGZTO), or aluminum-doped zinc oxide (AZO).

The protective layer 360 may cover the IGZO channel layer 320, the insulating layer 330, the first electrode 340, and the ohmic junction layer 350 on the substrate 310. Through this, the protective layer 360 may protect the IGZO channel layer 320, the insulating layer 330, the first electrode 340, and the ohmic junction layer 350 on the substrate 310. Here, at least one hole 365 may be formed in the protective layer 360. The hole 365 may penetrate the protective layer 360 and may connect from the outside of the protective layer 360 to the surface of the ohmic junction layer 350. According to an example embodiment, when the plurality of ohmic junction layers 350 is provided in the second region of the IGZO channel layer 320, the plurality of holes 365 may be provided to be spaced apart from each other in the protective layer 360.

The second electrode 370 may be bonded on the ohmic junction layer 350. Here, the second electrode 370 may be exposed to the outside of the protective layer 360 and may be bonded to the ohmic junction layer 350 by passing through the inside of the hole 365. According to an example embodiment, when the plurality of ohmic junction layers 350 is provided in the second region of the IGZO channel layer 320, the plurality of second electrodes 370 may be provided to the ohmic junction layers 350, respectively. Here, one of the second electrodes 370 may be a source electrode (source) and another one of the second electrodes 370 may be a drain electrode (drain). For example, the second electrode 370 may include at least one of tungsten (W), cobalt (Co), or ruthenium (Ru).

Figure 7:
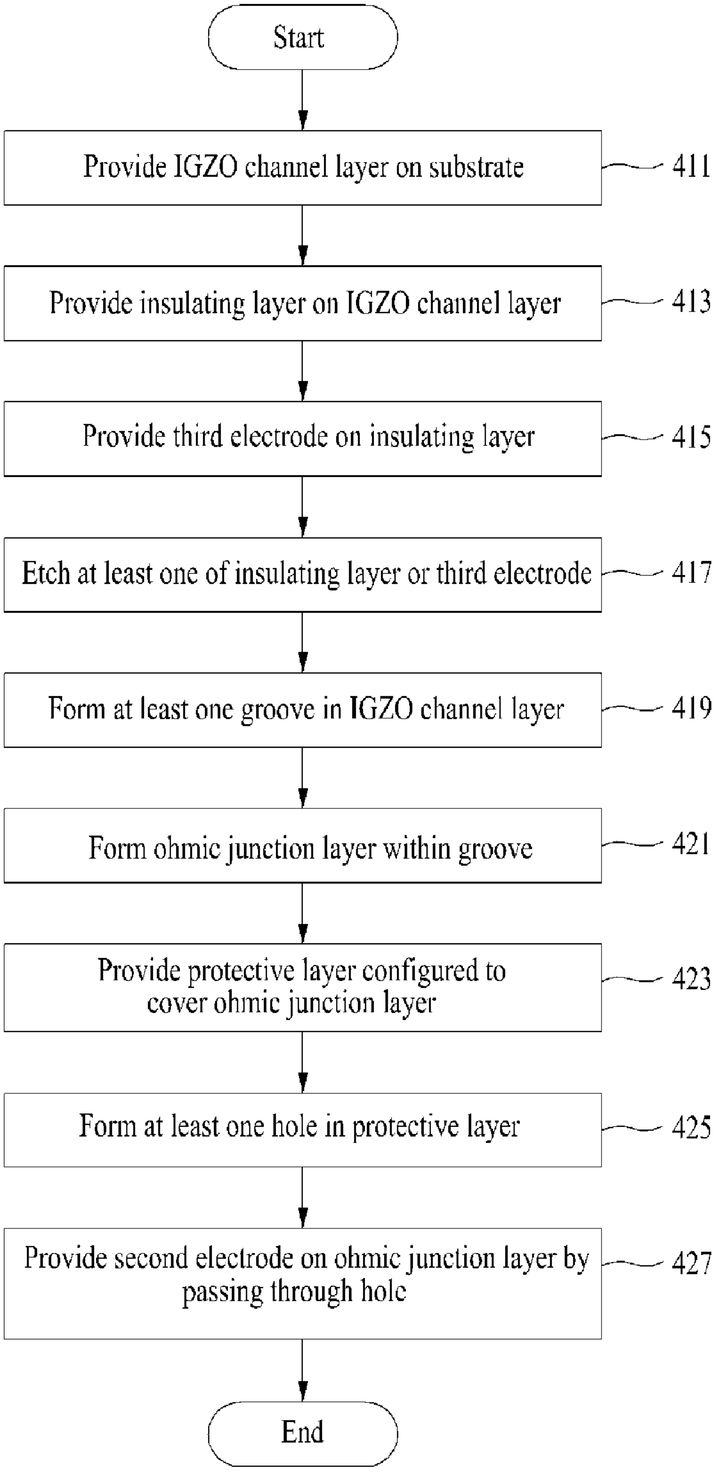
FIG. 7 illustrates a manufacturing method of a thin-film transistor according to various example embodiments.

FIG. 7 illustrates a manufacturing method of the thin-film transistor 300 according to various example embodiments. FIGS. 8, 9, 10, 11 12, 13, 14, 15, and 16 are views for describing a manufacturing method of the thin-film transistor 300 according to various example embodiments.

Figure 8:
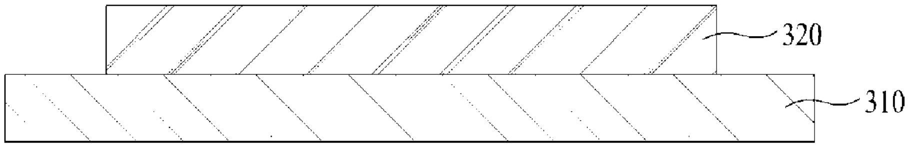
FIGS. 8, 9, 10, 11, 12, 13, 14, 15, and 16 are view for describing a manufacturing method of a thin-film transistor according to various example embodiments.

Referring to FIG. 7, in operation 411, the IGZO channel layer 320 may be provided on the substrate 310 as illustrated in FIG. 8. For example, the substrate 310 may include silicon (Si). Here, an area of the IGZO channel layer 320 may be identical to an area of the substrate 310 or may be less than the area of the substrate 310. Here, the IGZO channel layer 320 may be formed through combination of indium (In), gallium (Ga), zinc (Zn), and oxygen (O). The IGZO channel layer 320 may be divided into the first region and the second region. According to an example embodiment, the first region may be provided at the center of the IGZO channel layer 320 and the second region may surround the first region.

Figure 9:
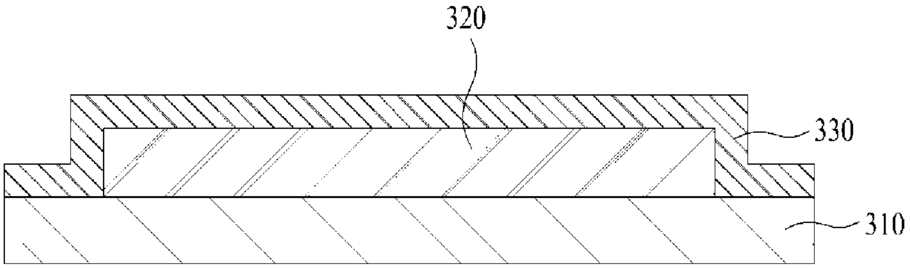

In operation 413, as illustrated in FIG. 9, the insulating layer 330 may be provided on the IGZO channel layer 320. According to an example embodiment, the insulating layer 330 may be formed to cover the IGZO channel layer 320 on the substrate 310. Here, the insulating layer 330 may also cover the second region as well as the first region of the IGZO channel layer 320. According to another example embodiment, although not illustrated, the insulating layer 330 may cover only the first region of the IGZO channel layer 320.

Figure 10:
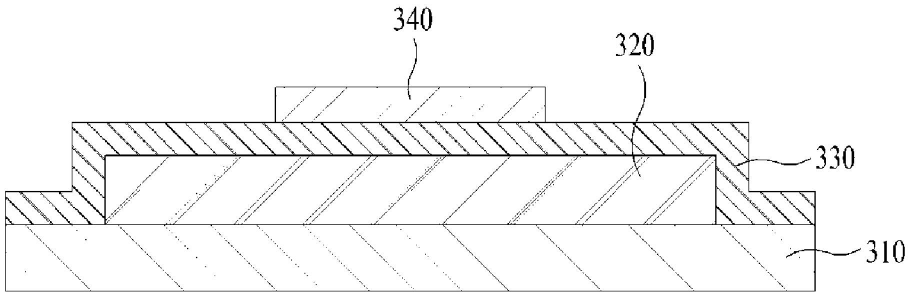

In operation 415, as illustrated in FIG. 10, the first electrode 340 may be provided on the insulating layer 330. Here, the first electrode 340 may be provided on the IGZO channel layer 320 by interposing the insulating layer 330 between the first electrode 340 and the IGZO channel layer 320. According to an example embodiment, the first electrode 340 may be provided in the first region of the IGZO channel layer 320. According to another example embodiment, although not illustrated, the first electrode 340 may also be provided on the second region as well as the first region of the IGZO channel layer 320. Here, the first electrode 340 may not be in direct contact with the IGZO channel layer 320. According to an example embodiment, the first electrode 340 may be a gate electrode. For example, the first electrode 340 may include at least one of tungsten (W), cobalt (Co), or ruthenium (Ru).

Figure 11:
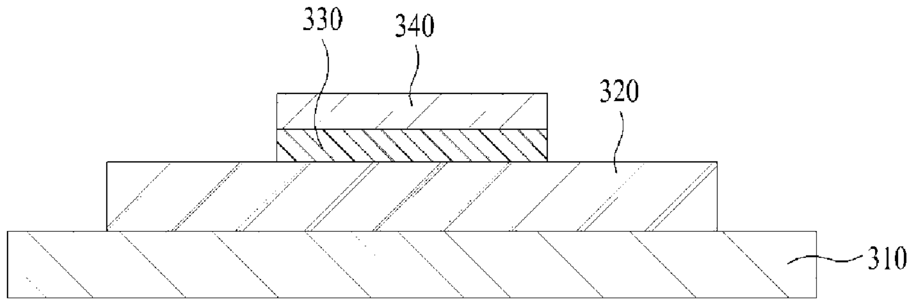

In operation 417, as illustrated in FIG. 11, at least one of the insulating layer 330 and the first electrode 340 may be etched. Here, at least one of the insulating layer 330 and the first electrode 340 may be removed from the second region of the IGZO channel layer 320 such that the second region of the IGZO channel layer 320 may be exposed from the insulating layer 330 and the first electrode 340. According to an example embodiment, when all of the insulating layer 330 and the first electrode 340 are provided on the second region as well as the first region of the IGZO channel layer 320, the insulating layer 330 and the first electrode 340 may be etched together. According to another example embodiment, when only the insulating layer 330 is provided on the second region as well as the first region of the IGZO channel layer 320, the insulating layer 330 may be etched. Through this, the insulating layer 330 and the first electrode 340 may remain only in the first region of the IGZO channel layer 320.

Figure 12:
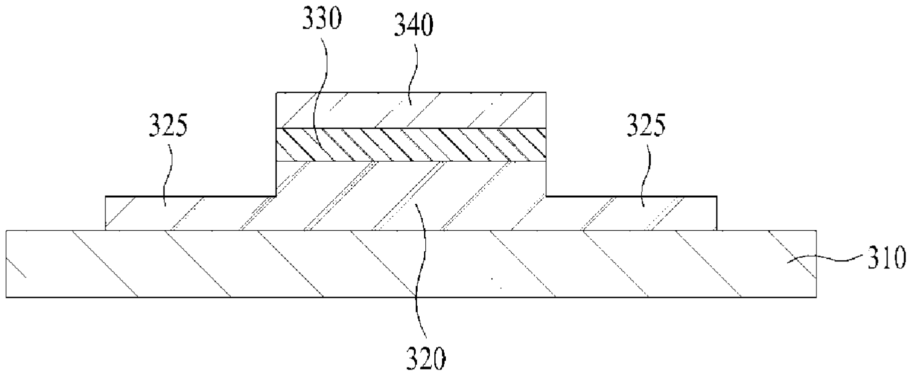

In operation 419, as illustrated in FIG. 12, at least one groove 325 may be formed in the IGZO channel layer 320. Here, the groove 325 may be formed in the second region of the IGZO channel layer 320. According to an example embodiment, the plurality of grooves 325 may be formed to be spaced apart from each other in the second region of the IGZO channel layer 320.

Figure 13:
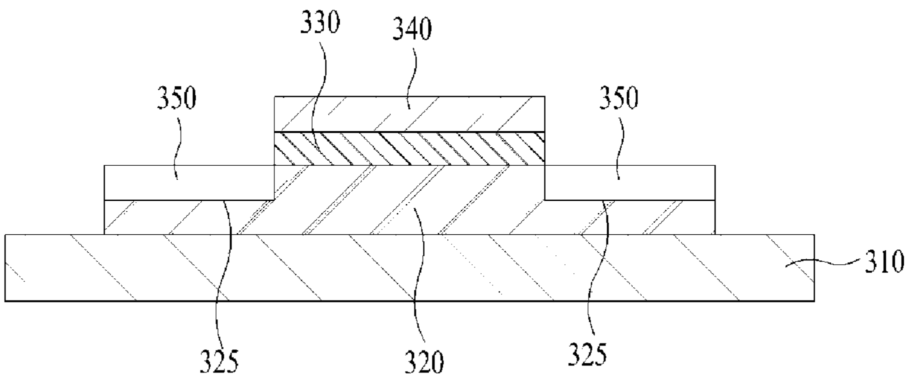

In operation 421, as illustrated in FIG. 13, the ohmic junction layer 350 may be formed within the groove 325 of the IGZO channel layer 320. According to an example embodiment, when the plurality of grooves 325 is formed in the second region of the IGZO channel layer 320, the plurality of ohmic junction layers 350 may be formed in the grooves 325, respectively. Here, the ohmic junction layer 350 may be made of an n+ oxide. For example, the n+ oxide may include at least one of IGTO, IGO, ITO, IGZTO, or AZO.

Figure 14:
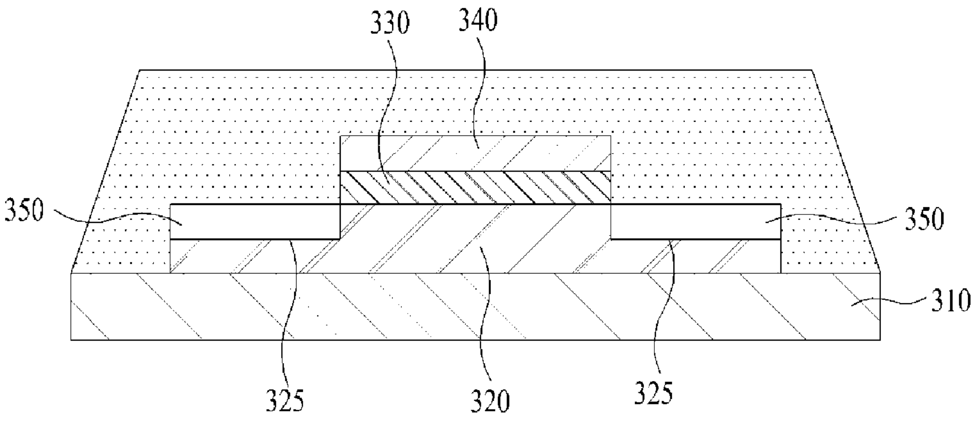

In operation 423, as illustrated in FIG. 14, the protective layer 360 configured to cover the IGZO channel layer 320, the insulating layer 330, the first electrode 340, and the ohmic junction layer 350 may be provided on the substrate 310. Through this, the protective layer 360 may protect the IGZO channel layer 320, the insulating layer 330, the first electrode 340, and the ohmic junction laver 350 on the substrate 310.

Figure 15:
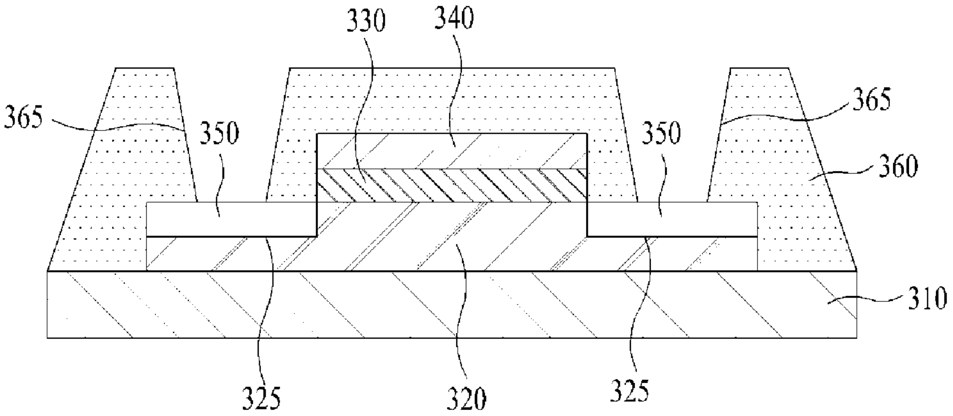

In operation 425, as illustrated in FIG. 15, at least one hole 365 may be formed in the protective layer 360. The hole 365 may penetrate the protective layer 360 and may connect from the outside of the protective layer 360 to the surface of the ohmic junction layer 350. According to an example embodiment, when the plurality of ohmic junction layers 350 is provided in the second region of the IGZO channel layer 320, the plurality of holes 365 may be formed to be spaced apart from each other in the protective layer 360.

Figure 16:
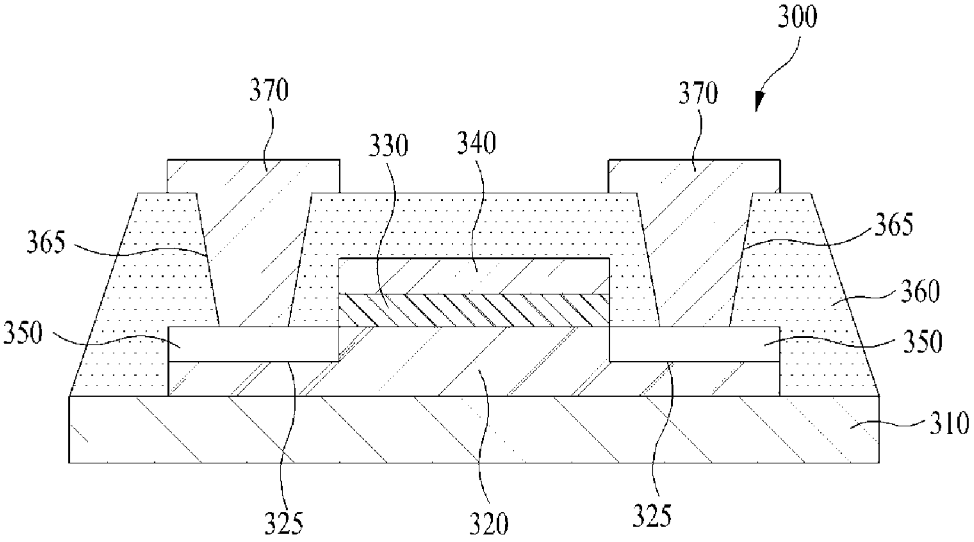

In operation 427, as illustrated in FIG. 16, the second electrode 370 may be formed on the ohmic junction layer 350. Here, the second electrode 370 may be exposed to the outside of the protective layer 360 and may be bonded to the ohmic junction layer 350 by passing through the inside of the hole 365. According to an example embodiment, when the plurality of ohmic junction layers 350 is provided in the second region of the IGZO channel layer 320, the plurality of second electrodes 370 may be bonded to the ohmic junction layers 350, respectively. Here, one of the second electrodes 370 may be a source electrode and another one of the second electrodes 370 may be a drain electrode. For example, the second electrode 370 may include at least one of tungsten (W), cobalt (Co), or ruthenium (Ru).

Accordingly, the thin-film transistor 300 may be manufactured.

According to various example embodiments, since the ohmic junction layer 350 is formed on the IGZO channel layer 320 using an n+ oxide having a high carrier concentration, the second electrode 370 may be bonded to the ohmic junction layer 350 without a direct contact with the IGZO channel layer 320. Here, since the ohmic junction layer 350 has a high carrier concentration, a low-resistance contact may be implemented between the ohmic junction layer 350 and the second electrode 370. That is, specific contact resistance for the second electrode 370 may be significantly improved in the thin-film transistor 300 having the IGZO channel layer 320. Through this, the thin-film transistor 300 having the IGZO channel layer 320 may be used for the memory device.

The thin-film transistor 300 according to various example embodiments may include the substrate 310, the IGZO channel layer 320 provided on the substrate 310 and divided into the first region and the second region in which at least one groove 325 is formed, the first electrode 340 provided on the first region of the IGZO channel layer 320, the ohmic junction layer 350 made of an n+ oxide and provided within the groove 325, and the second electrode 370 bonded on the ohmic junction layer 350.

According to various example embodiments, the n+ oxide may include at least one of IGTO, IGO, ITO, IGZTO, or AZO.

According to various example embodiments, the thin-film transistor 300 may further include the insulating layer 330 provided between the IGZO channel layer 320 and the first electrode 340.

According to various example embodiments, the thin-film transistor 300 may further include the protective layer 360 configured to cover the IGZO channel layer 320, the first electrode 340, and the ohmic junction layer 350 on the substrate 310 and in which the hole 365 that connects from the outside to the surface of the ohmic junction layer 350 is formed.

According to various example embodiments, the second electrode 370 may be exposed to the outside of the protective layer 360 and may be bonded to the ohmic junction layer 350 by passing through the inside of the hole 365.

According to various example embodiments, the first electrode 340 may be a gate electrode, and the second electrode 370 may include a source electrode and a drain electrode.

The manufacturing method of the thin-film transistor 300 according to various example embodiments may include providing the IGZO channel layer 320 on the substrate 310, providing the first electrode 340 on the first region of the IGZO channel layer 320, forming at least one groove 325 in the second region of the IGZO channel layer 320, forming the ohmic junction layer 350 within the groove 325 using an n+ oxide, and bonding the second electrode 370 on the ohmic junction layer 350.

According to various example embodiments, the n+ oxide may include at least one of IGTO, IGO, ITO, IGZTO, or AZO.

According to various example embodiments, the providing of the first electrode 340 may include providing the insulating layer 330 on the IGZO channel layer 320, providing the first electrode 340 on the insulating layer 330, and etching at least one of the insulating layer 330 or the first electrode 340 to correspond to the first region, such that the second region may be exposed from the insulating layer 330 and the first electrode 340.

According to various example embodiments, the providing of the second electrode 370 may include providing the protective layer 360 configured to cover the IGZO channel layer 320, the first electrode 340, and the ohmic junction layer 350 on the substrate 310, forming the hole 365 that connects from the outside of the protective layer 360 to the surface of the ohmic junction layer 350, and providing the second electrode 370 that is exposed to the outside of the protective layer 360 and to be bonded to the ohmic junction layer 350 by passing through the inside of the hole 365.

According to various example embodiments, the first electrode 340 may be a gate electrode and the second electrode 370 may include a source electrode and a drain electrode.

Various example embodiments and the terms used herein are not construed to limit description disclosed herein to a specific implementation and should be understood to include various modifications, equivalents, and/or substitutions of a corresponding example embodiment. In the drawings, like reference numerals refer to like components throughout the present specification. The singular forms "a," "an," and "the" are intended to include the plural forms as well, unless the context clearly indicates otherwise. Herein, the expressions, "A or B," "at least one of A and/or B," "A, B, or C," "at least one of A, B, and/or C," and the like may include any possible combinations of listed items. Terms "first," "second," etc., are used to describe corresponding components regardless of order or importance and the terms are simply used to distinguish one component from another component. The components should not be limited by the terms. When a component (e.g., a first component) is described to be "connected to" or "accessed to" another component (e.g., a second component), the component may be directly connected to the other component or may be connected through still another component (e.g., a third component).

According to various example embodiments, each of the components may include a singular objector a plurality of objects. According to various example embodiments, at least one of the components or operations may be omitted. Alternatively, at least one another component or operation may be added. Alternatively or additionally, a plurality of components may be integrated into a single component. In this case, the integrated component may perform one or more functions of each of the components in the same or similar manner as it is performed by a corresponding component before integration.

What is claimed is:

1. A manufacturing method of an oxide semiconductor, the method comprising:

preparing an indium gallium zinc oxide (IGZO) channel layer; and inducing a carrier diffusion in the IGZO channel layer using a group 4 element of a periodic table or a group 7 element of the periodic table, such that carriers introduced by the carrier diffusion are retained within the IGZO channel layer, wherein the inducing of the carrier diffusion comprises:

providing a doping film made of the group 4 element or the group 7 element on the IGZO channel layer; and inducing the carrier diffusion between the IGZO channel layer and the doping film through high-temperature heat treatment.

2. The method of claim 1, wherein the group 4 element includes at least one of germanium (Ge), tin (Sn), lead (Pb), silicon (Si), or carbon (C).

3. The method of claim 1, wherein the group 7 element includes at least one of fluorine (F), chlorine (Cl), bromine (Br), or iodine (I).

4. The method of claim 1, wherein the inducing of the carrier diffusion further comprises providing a metal electrode on the doping film before the high-temperature heat treatment, and wherein a low-resistance contact is implemented on the IGZO channel layer with respect to the metal electrode through the carrier diffusion.

5. The method of claim 1, wherein the preparing of the IGZO channel layer comprises providing the IGZO channel layer on a substrate.

6. An oxide semiconductor manufactured according to the method according to claim 1, wherein the oxide semiconductor comprises an IGZO channel layer including a region in which carrier diffusion has been induced using a group 4 element of a periodic table or a group 7 element of the periodic table, and carriers introduced by the carrier diffusion are retained within the IGZO channel layer.

7. A manufacturing method of an oxide semiconductor, the method comprising:

preparing an indium gallium zinc oxide (IGZO) channel layer; and inducing a carrier diffusion in the IGZO channel layer using a group 4 element of a periodic table or a group 7 element of the periodic table, such that carriers introduced by the carrier diffusion are retained within the IGZO channel layer, wherein the inducing of the carrier diffusion comprises:

applying plasma of the group 7 element to the IGZO channel layer and inducing the carrier diffusion between the IGZO channel layer and the plasma, and wherein a low-resistance contact is implemented on the IGZO channel layer with respect to a metal electrode provided on the IGZO channel layer through the carrier diffusion.

8. A manufacturing method of a thin-film transistor, the method comprising:

preparing an indium gallium zinc oxide (IGZO) channel layer on a substrate;

providing a first electrode on a first region of the IGZO channel layer;

forming at least one groove in a second region of the IGZO channel layer;

forming an ohmic junction layer within the groove using an n+ oxide; and bonding a second electrode on the ohmic junction layer.

9. The method of claim 8, wherein the n+ oxide includes at least one of indium gallium tin oxide (IGTO), indium gallium oxide (IGO), indium tin oxide (ITO), indium gallium zinc tin oxide (IGZTO), or aluminum-doped zinc oxide (AZO).

10. The method of claim 8, wherein the providing of the first electrode comprises:

providing an insulating layer on the IGZO channel layer;

providing the first electrode on the insulating layer; and etching at least one of the insulating layer or the first electrode to correspond to the first region, such that the second region is exposed from the insulating layer and the first electrode.

11. The method of claim 8, wherein the providing of the second electrode comprises:

providing a protective layer configured to cover the IGZO channel layer, the first electrode, and the ohmic junction layer on the substrate;

forming a hole that connects from outside of the protective layer to the surface of the ohmic junction layer; and providing the second electrode that is exposed to the outside of the protective layer and to be bonded to the ohmic junction layer by passing through the inside of the hole.

12. The method of claim 8, wherein the first electrode is a gate electrode, and the second electrode includes a source electrode and a drain electrode.

13. A thin-film transistor comprising:

a substrate;

an indium gallium zinc oxide (IGZO) channel layer provided on the substrate and divided into a first region and a second region in which at least one groove is formed;

a first electrode provided on the first region of the IGZO channel layer;

an ohmic junction layer made of an n+ oxide and provided within the groove; and a second electrode bonded on the ohmic junction layer.

14. The thin-film transistor of claim 13, wherein the n+ oxide includes at least one of indium gallium tin oxide (IGTO), indium gallium oxide (IGO), indium tin oxide (ITO), indium gallium zinc tin oxide (IGZTO), or aluminum-doped zinc oxide (AZO).

15. The thin-film transistor of claim 13, further comprising:

an insulating layer provided between the IGZO channel layer and the first electrode.

16. The thin-film transistor of claim 13, further comprising:

a protective layer configured to cover the IGZO channel layer, the first electrode, and the ohmic junction layer on the substrate and in which a hole that connects from outside to the surface of the ohmic junction layer is formed, wherein the second electrode is configured to be exposed to the outside of the protective layer and to be bonded to the ohmic junction layer by passing through the inside of the hole.

17. The thin-film transistor of claim 13, wherein the first electrode is a gate electrode, and the second electrode includes a source electrode and a drain electrode.

* * * * *